(12) United States Patent
Heerens et al.

(10) Patent No.: US 7,053,980 B2
(45) Date of Patent: May 30, 2006

(54) LITHOGRAPHIC ALIGNMENT SYSTEM

(75) Inventors: Gert-Jan Heerens, Schoonhoven (NL); Bastiaan Lambertus Wilhelmus Marinus Van De Ven, Den Bosch (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/762,568

(22) Filed: Jan. 23, 2004

(65) Prior Publication Data

US 2005/0162626 A1    Jul. 28, 2005

(51) Int. Cl.
  G03B 27/42       (2006.01)
  G03B 27/52       (2006.01)
(52) U.S. Cl. .......................... 355/53; 355/55
(58) Field of Classification Search .......... 355/53, 355/72–76; 414/935–936; 700/121
  See application file for complete search history.

(56) References Cited

U.S. PATENT DOCUMENTS

| | | | | |
|---|---|---|---|---|
| 5,825,470 A * | 10/1998 | Miyai et al. .................. 355/72 |
| 6,051,843 A * | 4/2000 | Nishi .......................... 250/548 |
| 6,697,145 B1 * | 2/2004 | Aoyama ....................... 355/53 |
| 6,798,491 B1 * | 9/2004 | Nishi et al. ................... 355/53 |
| 6,842,221 B1 * | 1/2005 | Shiraishi ...................... 355/30 |
| 2004/0150823 A1* | 8/2004 | Yamamoto .................. 356/401 |
| 2004/0223132 A1* | 11/2004 | Nishi .......................... 355/75 |

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus equipped with an alignment system is presented herein. In one embodiment, the lithographic apparatus includes an illumination system that provides a beam of radiation, a patterning device that imparts the beam of radiation with a desired pattern in its cross-section and is supported by a support structure, a substrate holder that holds a substrate, a projection system that projects the patterned beam onto a target portion of the substrate, and a conditioned chamber. The apparatus also includes an actuator that introduces either the patterning device or the substrate into the conditioned chamber and an alignment system, which is disposed outside the conditioned chamber, that positions the patterning device or the substrate in alignment with the projected patterned beam of radiation.

21 Claims, 5 Drawing Sheets

LITHOGRAPHIC ALIGNMENT SYSTEM

BACKGROUND OF THE INVENTION

1. Field of the Invention

The present invention relates to a lithographic apparatus and, in particular, to a lithographic alignment system.

2. Description of the Related Art

A lithographic apparatus is a machine that applies a desired pattern onto a target portion of a substrate. Lithographic apparatus can be used, for example, in the manufacture of integrated circuits (ICs). In that circumstance, patterning devices, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Prior art lithographic apparatus comprise a conditioned environment, such as a conditioned chamber, of which the interior conditions are controlled. The patterning device is positioned within the conditioned chamber when the desired pattern is projected onto a target portion of the substrate. The conditioned environment is advantageously used when radiation with a short wavelength is used. Such radiation, e.g. extreme ultra violet (EUV) radiation, is easily absorbed by any material and even by air. Therefore, the conditioned environment is an environment with reduced pressure (commonly referred to as vacuum) and/or a reduced particle concentration, i.e. a reduced concentration of dust particles and the like.

In other lithographic apparatus, the conditioned environment may be employed for other reasons than absorption of radiation. For example, the patterning device and/or substrate may be sensitive to gases present in atmospheric conditions. In such a case, only single objects such as the substrate or the patterning device may be positioned in the conditioned environment, in which case the walls of the conditioned chamber need to be transparent to the incident radiation.

In a lithographic apparatus, the patterning device and the substrate may each be replaced to project another pattern onto the substrate, project the same pattern on another substrate, or project another pattern on another substrate. For example, the patterning device may be removed from the conditioned environment and another patterning device may be brought into the conditioned environment. By this operation, the conditioned environment may be exposed at least temporarily to atmospheric conditions and dust, for example. Further, the patterning device and the substrate need to be aligned with a projection beam of radiation to obtain the projection at the target portion of the substrate with the right orientation.

In the prior art lithographic apparatus, a patterning device support structure and/or a substrate table may be positioned within the conditioned environment. The substrate and patterning device are introduced in the lithographic apparatus at a load position outside the conditioned environment. Then, the substrate and patterning device are introduced in the conditioned environment by an actuator moving the substrate and patterning device from the load position to the conditioned environment.

Further, in the prior art lithographic apparatus, an alignment system for aligning the patterning device and/or the substrate is positioned within the conditioned environment. The alignment system comprises at least one position and orientation sensor and at least one actuator. The one or more position and orientation sensors detect the position and orientation of the patterning device and/or the substrate. The actuator, or plurality of actuators, may position the substrate and the patterning device relative to the projection beam of radiation. Then, the projection beam of radiation is imparted with the desired pattern by the patterning device and a target portion of the substrate within the conditioned environment is exposed to the patterned projection beam of radiation.

The alignment system as referred to herein may be an alignment or a pre-alignment system. A pre-alignment system may align an object, such as a substrate or a patterning device, with an accuracy that is lower than the required accuracy. Thereafter, an alignment system may align the object with the required higher accuracy.

The sensor and actuator of the alignment system positioned in the conditioned environment need to be a special, relatively expensive sensor and actuator, since a common, cost-effective sensor and a common, cost-effective actuator may not be resistant to the environmental conditions in the conditioned environment. As an example, vacuum, i.e. a very low pressure, may damage a sensor or an actuator due to pressure differences inside and outside the sensor or actuator. In addition, an actuator may comprise moving parts that may generate particles due to friction between the moving parts, resulting in a pollution of the conditioned environment. Hence, special sensors and actuators are required which can withstand pressure differences, and which do not generate particles.

Not only does the use of the conditioned environment require special sensors and actuators, these sensors and actuators also need to be positioned in a very little space available near the support structures of the substrate and patterning device, resulting in high development and material costs.

SUMMARY OF THE INVENTION

Principles of the present invention, as embodied and broadly described herein, provide for a lithographic apparatus having an alignment system that aligns the patterning device and/or substrate by employing common, cost-effective sensors and actuators. In one embodiment, the apparatus comprises an illumination system to provide a beam of radiation, a support structure configured to support a patterning device that imparts the beam of radiation with a pattern in its cross-section, a substrate holder configured to hold a substrate, a projection system to project the patterned beam radiation onto a target portion of the substrate, a conditioned environment wherein the patterning device and/or the substrate is positionable to project the patterned beam onto the target portion of the substrate, an actuator configured to introduce the patterning device or substrate in the conditioned environment, and an alignment system positioned outside the conditioned environment configured to prepare the positioning of the patterning device or substrate in alignment with the projection beam of radiation.

By providing an alignment system outside the conditioned environment, e.g. positioned in atmospheric conditions, any sensor capable of detecting the position and orientation of the patterning device and the substrate can be used. With respect to the environmental conditions, there is no limitation on the sensor and the actuator comprised in such an alignment system. A common, cost-effective sensor and actuator may be used.

Since the substrate and/or patterning device are being prepared to be aligned with the radiation beam outside the conditioned environment, after alignment the substrate and/or patterning device need to be moved from the alignment system to the corresponding support structures in the conditioned environment, i.e. the substrate table and/or the patterning device support structure, respectively. The actuator configured to introduce the substrate, the patterning device, or both in the conditioned environment may collect them at the alignment system and move them into the conditioned environment.

The actuator may comprise a carrier connected to an actuator arm. An actuator having an actuator arm, e.g. a robot having a robot arm, is known in the art for moving an object from a loading position where the object is loaded into the apparatus to a support structure. It is advantageous to use the known actuator to move the substrate or patterning device from a loading position to the alignment system and from the alignment system to the corresponding support structure, since little or maybe even no changes need to be made to a known lithographic apparatus.

The alignment system may be positioned in the robot arm trajectory from load position to support structure, such that the robot arm may collect the substrate or the patterning device at the loading position and move the object to the alignment system. After alignment, the robot may move the substrate or the patterning device from the alignment system to the corresponding support structure in the conditioned environment.

The alignment system may also be positioned at the loading position such that the known robot arm may be employed without any changes. The substrate or the patterning device will then be aligned at the position where it is loaded. After alignment, the robot arm may take the substrate or the patterning device from the loading position to the corresponding support structure in the conditioned environment.

The substrate or patterning device need be moved from the alignment system to the corresponding support structure. During movement, the substrate or the patterning device may move relative to the carrier due to generated forces. For example, inertia may make the substrate or the patterning device move relative to the carrier when the carrier accelerates. Only with a limited acceleration, friction between carrier and substrate or patterning device will be enough to prevent a relative movement. A relative movement will result in misalignment of the substrate or the patterning device. Therefore, advantageously, the carrier may be provided with a fixation device configured to fix the substrate or the patterning device relative to the carrier.

Further, due to friction between the substrate or the patterning device and the carrier, when the substrate or the patterning device moves relative to the carrier, particles may be generated. These particles may pollute the conditioned environment. Therefore, it is advantageous to provide the carrier with a fixation device to fix the substrate or the patterning device during movement, so that no misalignment and no particle generation may occur.

Any kind of fixation device may be used, such as a mechanical coupling device or a magnetic coupling device, as long as the fixation device does not distort the substrate or the patterning device and fixes them at their position and orientation after alignment.

Further, since the alignment is not performed at or near the support structure in the conditioned environment, there needs to be a reference point to which the substrate or the patterning device is aligned. With a reference point at a position known in relation to both the alignment system outside the conditioned environment and the support structure inside the conditioned environment, the alignment may be accurately performed. After alignment, the substrate or the patterning device may be moved to the corresponding support structure and be positioned there without misalignment.

Advantageously, a reference point is defined with respect to the carrier, since the carrier takes the substrate or patterning device from the alignment system to the corresponding support structures and thus the reference point is taken from alignment system to the support structure. Fixing the substrate or the patterning device to the carrier during movement fixes the substrate or patterning device with respect to the reference point.

It is noted that the reference point may be a virtual, not-specified reference point. If the position of the carrier is known relative to the alignment system, and if after movement the relative position of the carrier with respect to the support structure is known, the positions are known in relation to any not-specified reference point.

With a reference point with respect to the carrier being defined, the position of the alignment system may be defined with respect to the reference point. To this end, in an embodiment of the present invention, the alignment system is provided with a docking system configured to dock the carrier. Such a docking system positions the carrier, and thus the reference point, accurately with respect to the alignment system. Analogously, the support structure may be provided with a docking system configured to dock the carrier.

The docking system may be any kind of docking system that connects the carrier with the alignment system or support structure. Mechanical or magnetic coupling may be employed, for example. Advantageously, the docking system does not distort the carrier, the alignment system and the support structures. Also, the substrate or the patterning device should not be distorted in any way, nor should their position and orientation be disturbed. Unpublished European Patent Application No. 03 077 308.9 discloses a docking system that may advantageously be employed.

According to a further aspect of the invention, there is provided a device manufacturing method comprising providing a substrate, providing a projection beam of radiation using an illumination system, providing a patterning device, introducing any one of the substrate and the patterning device in a conditioned environment using an actuator, aligning said any one of the substrate and the patterning device with the projection beam of radiation outside the conditioned environment before introducing said any one of the substrate and the patterning device in the conditioned environment, using the patterning device to impart the projection beam with a pattern in its cross-section, and projecting the patterned beam of radiation onto a target portion of the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EV) radiation (e.g. having a wavelength in the range of 5–20 nm), as well as particle beams, such as ion beams or electron beams.

The term "patterning device" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning devices, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Associated Lithographic Apparatus

Figure 1:
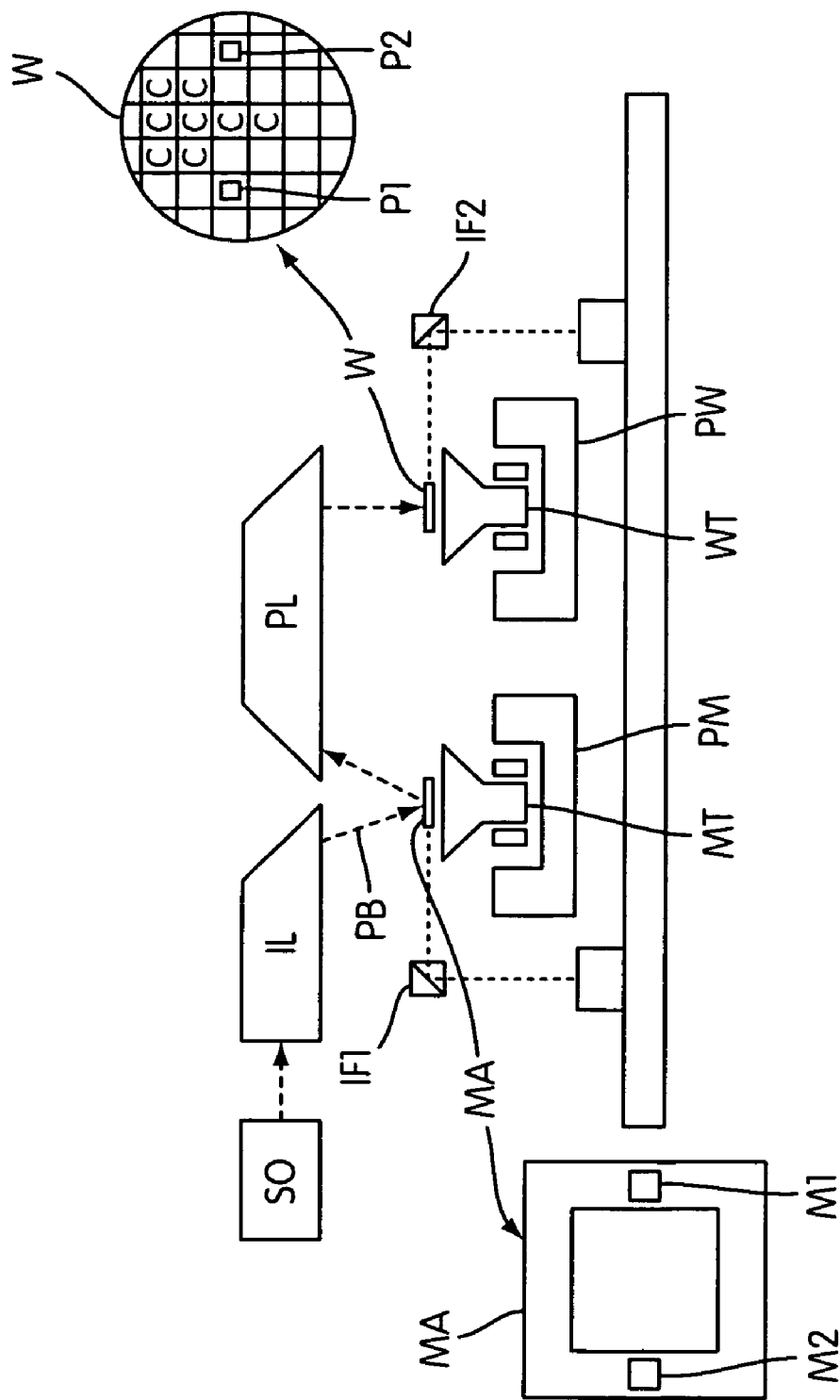
FIG. 1 depicts a lithographic apparatus according to an embodiment of the invention.

FIG. 1 schematically depicts a lithographic projection apparatus according to a particular embodiment of the invention. The apparatus comprises:

an illumination system IL: to supply a projection beam PB of radiation (e.g. UV, EUV radiation);

a first object table (mask table or holder) MT: a mask holder for holding a mask MA (e.g. a reticle), and connected to first positioning mechanism PM for accurately positioning the mask with respect to item PL;

a second object table (substrate table or substrate holder) WT: a substrate holder for holding a substrate W (e.g. a resist-coated silicon wafer), and connected to second positioning mechanism PW for accurately positioning the substrate with respect to item PL; and a projection system ("lens") PL: (e.g. a quartz and/or $CaF_2$ lens system or a catadioptric system comprising lens elements made from such materials, or a mirror system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source SO (e.g. a UV excimer laser, a laser-fired plasma source, a discharge source, or an undulator or wiggler provided around the path of an electron beam in a storage ring or synchrotron) produces a beam of radiation. This beam is fed into illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source SO may be within the housing of the lithographic projection apparatus (as is often the case when the source SO is a mercury lamp, for example), but that it may also be remote from the lithographic projection apparatus, the radiation beam which it produces being led into the apparatus (e.g. with the aid of suitable directing mirrors); this latter scenario is often the case when the source SO is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning mechanism PW (and interferometric measuring mechanism IF), the substrate table WT can be moved accurately, e.g. so as to position different target portions C in the path of the beam PB. Similarly, the first positioning mechanism PM can be used to accurately position the mask MA with respect to the path of the beam PB, e.g. after mechanical retrieval of the mask MA from a mask library, or during a scan.

In general, movement of the object tables MT, WT will be realized with the aid of a long-stroke module and a short-stroke module, which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in different modes:

step mode: the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and scan mode: essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

other mode: the mask table MT is kept essentially stationary holding a programmable patterning means, and the substrate table WT is moved or scanned while a pattern imparted to the projection beam is projected onto a target field C. In this mode, generally a pulsed radiation source is employed and the programmable patterning means is updated as required after each movement of the substrate table WT or in between successive radiation pulses during a scan. This mode of operation can be readily applied to maskless lithography that utilizes programmable patterning means, such as a programmable mirror array of a type as referred to above.

Combinations and/or variations on the above described modes of use or entirely different modes of use may also be employed by lithographic apparatus.

Embodiments

FIGS. 2A–2G illustrate a part of an embodiment of a lithographic apparatus according to the present invention. A mask 2, i.e. a patterning device, may be safely transported or stored outside the lithographic apparatus in a storage container 4. The storage container 4 having the mask 2 therein may be inserted or attached to a loading system 6 at a loading position of the lithographic apparatus.

An alignment system 8 is provided next to the loading system 6 in a non-conditioned environment according to the present invention. The alignment system 8 comprises a sensor 10 for determining the position and orientation of the mask 2 and an actuator 12 for aligning the mask 2. In another embodiment, the alignment system may also be combined with the loading system 6.

Further, a robot 14, or any other suitable kind of actuator, having a robot arm 16 is provided. A carrier 18 is connected to the robot arm 16. The carrier 18 may be displaced by the robot arm 16 horizontally (Y-direction as indicated in FIGS. 2A–2G) and vertically (Z-direction).

A mask table 22, i.e. a patterning device support structure, is positioned in a conditioned chamber 20 comprised in the lithographic apparatus. The chamber 20 may have a reduced pressure and/or a reduced particle concentration, e.g. reduced concentration of dust particles and the like. The mask table 22 is provided with a docking system 24 to which the carrier 18 may be connected or attached such that it is accurately positioned. Although not shown in FIGS. 2A–2G, the alignment system 8 may also be provided with such a docking system.

Figure 2A:
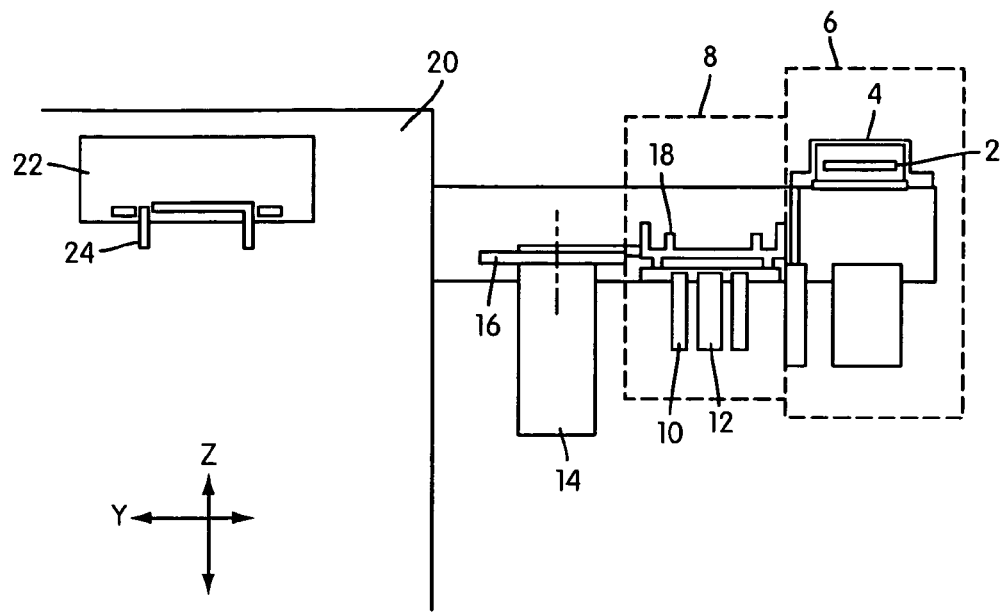
FIGS. 2A–2G schematically depict an exemplary sequence for collecting, aligning and moving a patterning device according to the present invention.

FIGS. 2A–2G illustrate various steps in a sequence of loading a mask, aligning the mask and transporting the mask to the mask table. In FIG. 2A, a mask 2 is positioned inside the storage container 4. The storage container 4 is inserted into the loading system 6. In the storage container 4, the mask 2 is protected from being damaged, in particular when the mask is handled outside the lithographic apparatus.

Figure 2B:
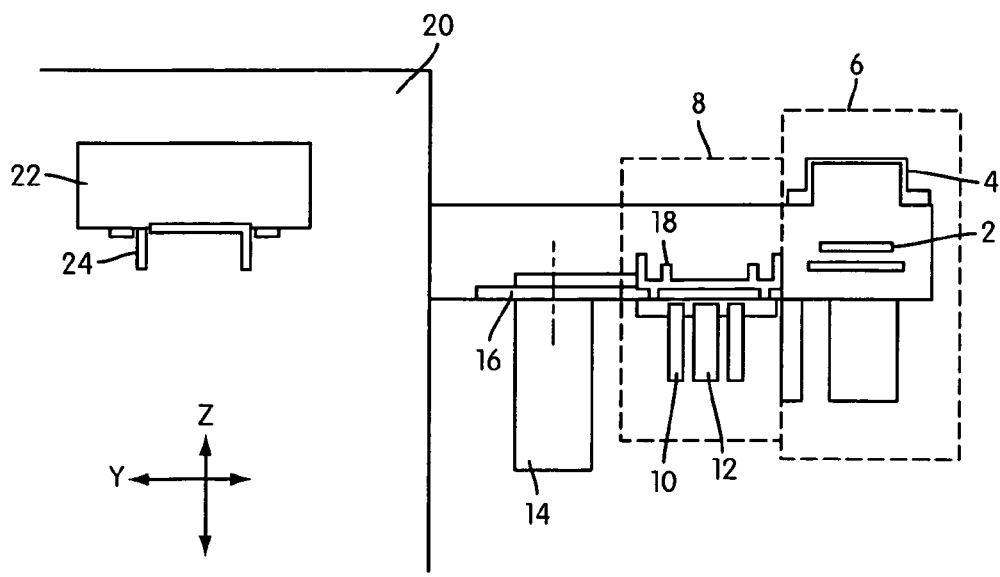
Figure 2C:
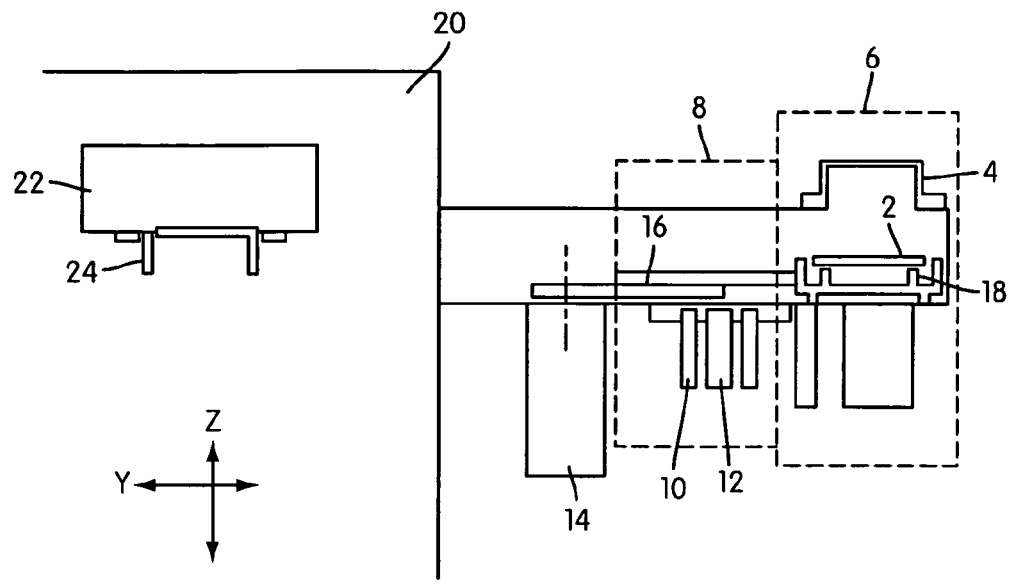

In FIG. 2B, the mask 2 is removed from the storage container 4 into the loading system 6. In FIG. 2C, the carrier 18 enters the loading system 6 to collect the mask 2. The mask 2 is put on the carrier 18 using gravity, although a suitable system may be used to place the mask 2 on the carrier 18. The position of the mask 2, however, is not controlled and thus the mask 2 may be positioned and orientated randomly.

Figure 2D:
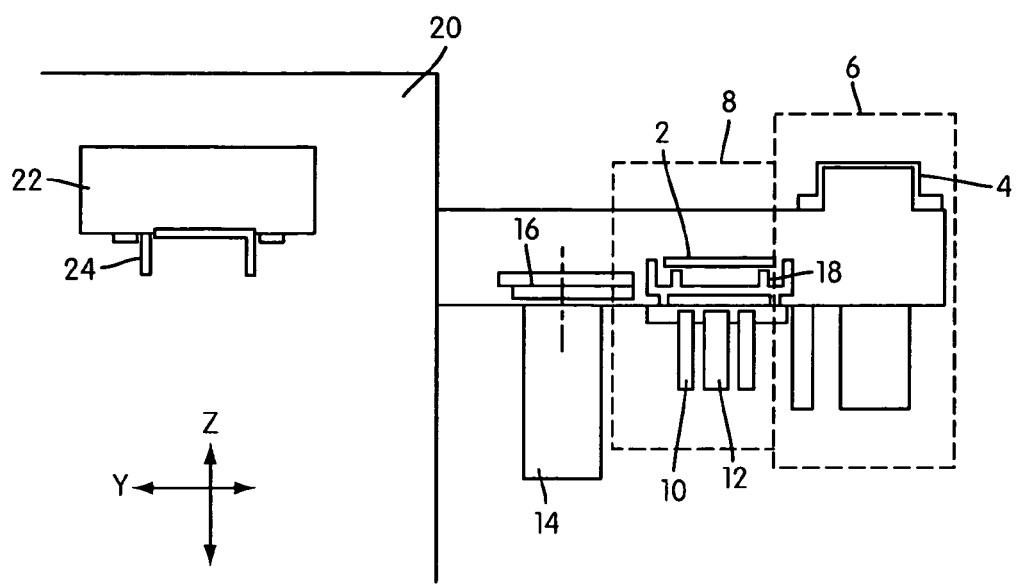

In the embodiment shown in FIGS. 2C–2D, after the mask 2 has been placed on the carrier 18, the robot 14 controls the robot arm 16 to move the carrier 18 from the loading system 6 to the alignment system 8.

In FIG. 2D, the carrier 18 with mask 2 is positioned at the alignment system 8. If the alignment system 8 and the carrier 18 are provided with a docking system, the carrier 18 may be mechanically or magnetically, or using any other principle, coupled to the alignment system 8 such that the carrier 18 is accurately positioned. The alignment system 8 uses the sensor 10 to determine the position and orientation of the mask 2 with respect to a reference point on the carrier 18. Next, the actuator 12 comprised in the alignment system 8 positions the mask 2 with respect to the carrier 18 according to alignment requirements in response to the position and orientation determination of the sensor 10. In another embodiment, the robot 14 may be used to position the mask 2 instead of a separate actuator 12.

If the carrier 18 is provided with a fixation device, the mask 2 will be fixed at its position and with its orientation to the carrier 18 before the carrier 18 starts to accelerate. When the carrier 18 moves, the mask 2 can then not move relative to the carrier 18. If no fixation device is provided, the mask 2 may be kept at its position by only slowly accelerating the carrier 18 such that no forces greater than the friction between the mask 2 and the carrier 18 are exerted on the mask 2.

Figure 2E:
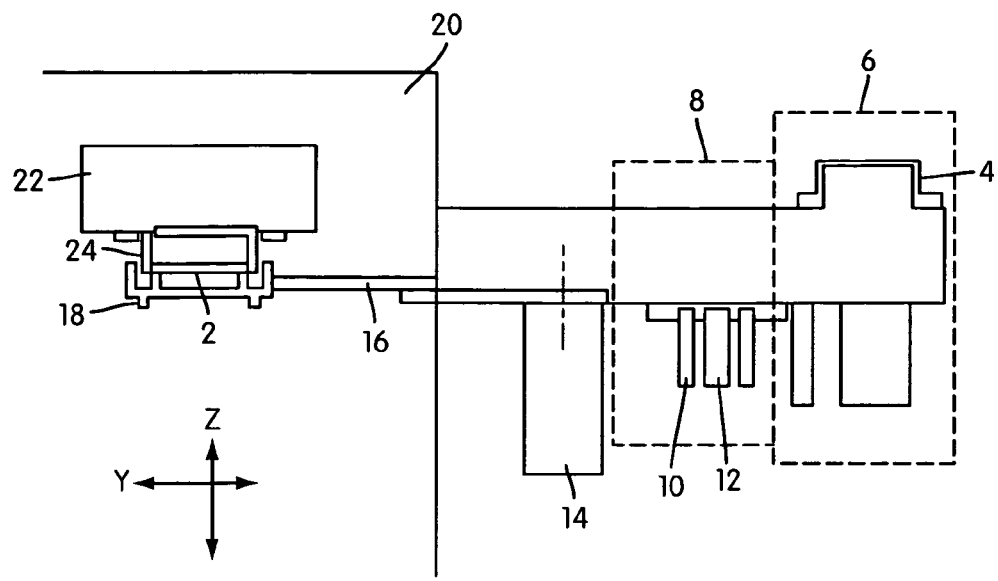

In FIG. 2E, the robot 14 has transported the mask 2 to the mask table 22. The mask table 22 is positioned in a conditioned environment 20. This may be a chamber with a reduced pressure or with a reduced particle concentration, or both. To enter the conditioned environment 20, the carrier 18 with mask 2 may have passed through a gate chamber (not shown), wherein possibly present dust (particles) and/or air is removed. However, there may be another device present to prevent air and/or dust from entering the conditioned environment 20, or no device may be present at all, in which case the air or dust entering the conditioned environment 20 is removed from the conditioned environment 20 when the chamber 20 is closed again.

Figure 2F:
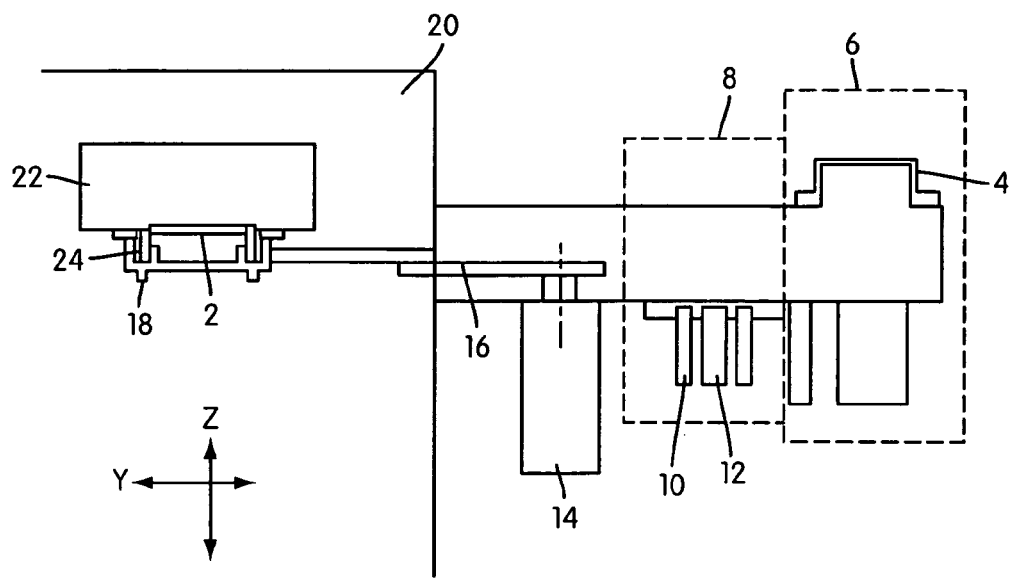

In FIG. 2F, the carrier 18 is moved vertically to bring the mask 2 at the mask table 22. The mask table 22 is provided with a docking system 24. For example, the docking system 24 may mechanically, or using any other principle, couple the carrier 18 such that the carrier 18 is accurately positioned. This coupling ensures an accurate alignment of the mask 2 at the mask table 22, since the alignment of the mask 2 has been performed relative to a reference point at the carrier 18 and the carrier 18 is accurately aligned by the coupling.

The mask 2 should be transferred to the mask table 22 without any uncontrolled movement, which would lead to misalignment. Thereto, the transfer system may be designed as described in European patent application no. 03 077 308.9. However, other systems suitable for transferring the mask 2 from the carrier 18 to the mask table 22 without causing misalignment of the mask 2 may be employed.

Figure 2G:
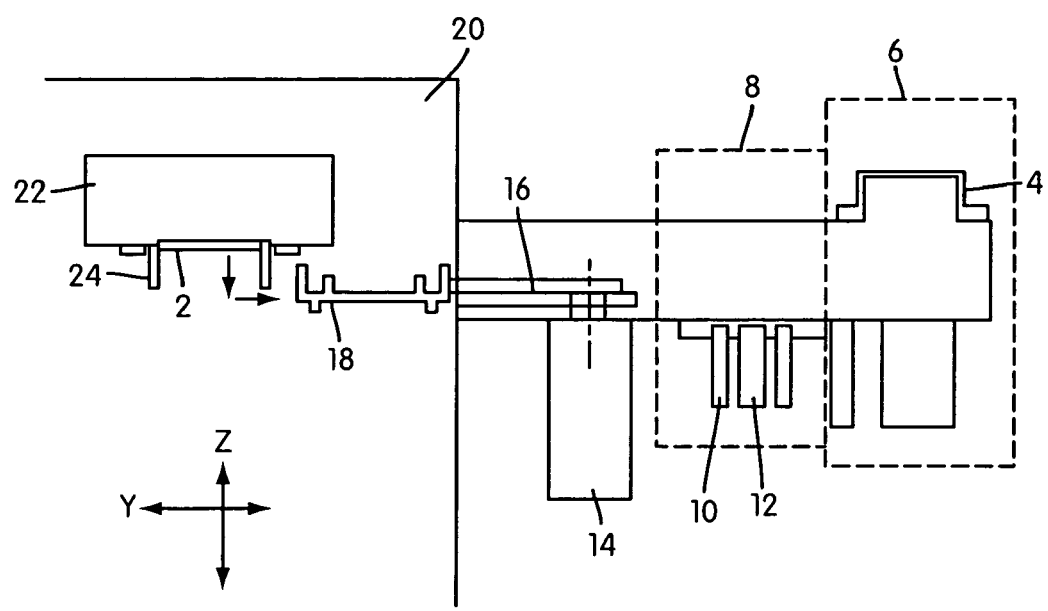

After the mask 2 has been positioned at the mask table 22, the carrier 18 is moved away from the mask table 22, as shown in FIG. 2G. The mask is now positioned at the mask table 22 and aligned with respect to a reference point of the mask table 22.

The mask table 22, and thus mask 2, may be aligned with a projection beam and a substrate (both not shown) without a need for special alignment sensors that are suited for operation in a conditioned environment 20. However, the alignment described above may be a pre-alignment, and an alignment with a higher accuracy may be performed by another alignment system.

A person skilled in the art will readily appreciate that the present invention is not limited to aligning the patterning device 2 as described in relation to FIGS. 2A–2G, but that other objects, such as the substrate, may also be aligned outside the conditioned environment 20, and thereafter be positioned in the conditioned environment 20.

While specific embodiments of the invention have been described above, it will be appreciated that the invention may be practiced otherwise than as described. The description is not intended to limit the invention.

What is claimed is:

1. A lithographic apparatus comprising:
   an illumination system configured to provide a beam of radiation;
   a support structure constructed to support a patterning device, said patterning device configured to impart said beam of radiation with a desired pattern in its cross-section;
   a substrate holder configured to hold a substrate;
   a projection system configured to project said patterned beam onto a target portion of said substrate;
   a conditioned chamber;
   an actuator configured to introduce at least one of said patterning device and said substrate into said conditioned chamber;
   a carrier structure, coupled to said actuator, configured to support said at least one of said patterning device and said substrate during the introduction into said conditioned chamber; and
   an alignment system, disposed outside said conditioned chamber, configured to position said at least one of said patterning device and said substrate in alignment with said projected patterned beam of radiation by determining position and orientation of said at least one of said patterning device and said substrate relative to a reference point on said carrier structure and adjusting said position and orientation of said at least one of said patterning device and said substrate in accordance with said reference point.

2. The lithographic apparatus of claim 1, wherein said actuator includes an actuator arm that is coupled to said carrier structure, which is configured to move said at least one of said patterning device and said substrate from said alignment system to said support structure or substrate holder within said conditioned chamber, respectively.

3. The lithographic apparatus of claim 2, wherein said carrier structure is provided with a fixation device configured to fix said at least one of said patterning device and said substrate to said carrier structure.

4. The lithographic apparatus of claim 2, wherein said alignment system is provided with a docking system configured to dock said carrier structure.

5. The lithographic apparatus of claim 2, wherein said at least one of said patterning device and said substrate is provided with a docking system configured to dock said carrier structure.

6. The lithographic apparatus of claim 1, wherein said conditioned chamber comprises a reduced pressure environment.

7. The lithographic apparatus of claim 1, wherein said conditioned chamber comprises a reduced particle concentration environment.

8. A device manufacturing method comprising:
   providing a substrate;
   providing a beam of radiation;
   providing a patterning device;
   placing at least one of said substrate and said patterning device onto a carrier structure;
   aligning said at least one of said substrate and said patterning device with said beam of radiation outside of a conditioned chamber by:
   (a) determining position and orientation of said at least one of said patterning device and said substrate relative to a reference point on said carrier structure, and
   (b) adjusting said position and orientation of said at least one of said patterning device and said substrate in accordance with said reference point;
   introducing said at least one of said substrate and said patterning device into a conditioned chamber;
   configuring said beam of radiation with a desired pattern in its cross-section based on said patterning device;

projecting said patterned beam of radiation onto a target portion of said substrate.

9. The device manufacturing method of claim 8, wherein said introducing comprises actuating said carrier structure to support and move said at least one of said patterning device and said substrate from an alignment system to a support structure or a substrate holder contained within said conditioned chamber, respectively.

10. The device manufacturing method of claim 9, further including securing said at least one of said patterning device and said substrate to said carrier structure.

11. The device manufacturing method of claim 9, wherein said aligning includes docking said carrier structure with a docking system.

12. The device manufacturing method of claim 9, further including providing said at least one of said patterning device and said substrate with a docking system configured to dock said carrier structure.

13. The device manufacturing method of claim 8, wherein said conditioned chamber comprises a reduced pressure environment.

14. The device manufacturing method of claim 8, wherein said conditioned chamber comprises a reduced particle concentration environment.

15. A lithographic apparatus comprising:
   a patterning device configured to impart a beam of radiation with a desired pattern in its cross-section, said patterning device being supported by a support structure;
   a projection system configured to project said patterned beam onto a target portion of a substrate;
   a conditioned chamber that houses said support structure;
   an actuator configured to introduce said patterning device into said conditioned chamber; and
   an alignment system, disposed outside said conditioned chamber, to align said patterning device with said projected patterned beam of radiation by:
   (a) determining position and orientation of said patterning device relative to a reference point on a carrier structure that supports said patterning device during the introduction of said patterning device into said conditioned chamber, and
   (b) adjusting said position and orientation of said patterning device based on said reference point.

16. The lithographic apparatus of claim 15, wherein said actuator includes an actuator arm having a carrier structure, said carrier structure configured to support and move said patterning device and said substrate from said alignment system to said support structure.

17. The lithographic apparatus of claim 16, wherein said carrier structure is provided with a fixation device configured to secure said patterning device to said carrier structure.

18. The lithographic apparatus of claim 16, wherein said alignment system is provided with a docking system configured to dock said carrier structure.

19. The lithographic apparatus of claim 16, wherein said patterning device is provided with a docking system configured to dock said carrier structure.

20. The lithographic apparatus of claim 15, wherein said conditioned chamber comprises a reduced pressure environment.

21. The lithographic apparatus of claim 15, wherein said conditioned chamber comprises a reduced particle concentration environment.

* * * * *